United States Patent
Inui et al.

(10) Patent No.: US 8,970,125 B2
(45) Date of Patent: Mar. 3, 2015

(54) UV IRRADIATION APPARATUS

(75) Inventors: Tsuyoshi Inui, Aichi (JP); Hideo Kado, Osaka (JP)

(73) Assignee: Panasonic Industrial Devices Sunx Co., Ltd., Aichi (JP)

( * ) Notice: Subject to any disclaimer, the term of this patent is extended or adjusted under 35 U.S.C. 154(b) by 0 days.

(21) Appl. No.: 13/512,589

(22) PCT Filed: Dec. 2, 2009

(86) PCT No.: PCT/JP2009/070224
§ 371 (c)(1),
(2), (4) Date: Jun. 21, 2012

(87) PCT Pub. No.: WO2011/067836
PCT Pub. Date: Jun. 9, 2011

(65) Prior Publication Data
US 2012/0261595 A1    Oct. 18, 2012

(51) Int. Cl.
*H05B 41/36* (2006.01)
*B41F 23/04* (2006.01)
(Continued)

(52) U.S. Cl.
CPC ........... *B41J 11/002* (2013.01); *B41F 23/0453* (2013.01); *C02F 2201/326* (2013.01);
(Continued)

(58) Field of Classification Search
USPC .............. 250/504 R; 315/312, 315, 291, 294, 315/297, 307, 362
See application file for complete search history.

(56) References Cited

U.S. PATENT DOCUMENTS 4,330,706 A * 5/1982 Lawenhaupt ........... 250/214 AL
5,748,090 A * 5/1998 Borg et al. ..................... 340/578
(Continued)

FOREIGN PATENT DOCUMENTS

CN    101386194 A    3/2009
CN    101468344 A    7/2009
(Continued)

OTHER PUBLICATIONS

International Search Report for the Application No. PCT/JP2009/070224 mailed Mar. 2, 2010.
(Continued)

*Primary Examiner* — Jack Berman
*Assistant Examiner* — James Choi
(74) *Attorney, Agent, or Firm* — Cheng Law Group, PLLC

(57) ABSTRACT

In a memory unit 6, there is stored a correction table for each candidate value of an output set value of each of LED units 2. If UV rays have ever been emitted so far by the LED units 2, each of which is formed of a plurality of LED chips 8, then a PLC 5 acquires, upon setting of a output set value by an operation unit 53, a correction value corresponding to a cumulative emission time up to a previous emission, from the correction table of the output set value. Thereafter, the PLC 5 sets the magnitude of the power supplied to each of the LED units 2 using the acquired correction value. If an output set value different from a previous output set value is set, the PLC 5 obtains the correction value starting from the cumulative emission time upon modification. As a result, the UV irradiation apparatus enables power consumption necessary for emission of UV rays to be reduced, and UV ray output to be kept constant regardless of the cumulative emission time, even if the output set value is modified.

9 Claims, 8 Drawing Sheets

(51) Int. Cl.
*B41J 11/00* (2006.01)
*H01L 25/075* (2006.01)
*C02F 1/32* (2006.01)
*H01L 25/16* (2006.01)

(52) U.S. Cl.
CPC ..... *C02F2201/3222* (2013.01); *B41F 23/0409* (2013.01); *H01L 25/0753* (2013.01); *C02F 1/325* (2013.01); *H01L 25/167* (2013.01)
USPC ........... 315/291; 315/312; 315/315; 315/294; 315/297; 315/307; 315/362; 315/360; 250/504 R

(56) References Cited

U.S. PATENT DOCUMENTS

| | | | | |
|---|---|---|---|---|
| 6,153,985 | A * | 11/2000 | Grossman | 315/291 |
| 6,309,216 | B1 * | 10/2001 | Parker | 433/29 |
| 6,981,448 | B2 * | 1/2006 | Kimura | 101/488 |
| 7,288,902 | B1 | 10/2007 | Melanson | |
| 8,093,310 | B2 | 1/2012 | Hirose | |
| 2004/0007980 | A1 * | 1/2004 | Shibata | 313/634 |
| 2004/0237824 | A1 | 12/2004 | Kimura | |
| 2006/0121208 | A1 * | 6/2006 | Siegel | 427/487 |
| 2006/0280375 | A1 | 12/2006 | Dalton et al. | |
| 2007/0040696 | A1 * | 2/2007 | Mubaslat et al. | 340/657 |
| 2008/0224633 | A1 * | 9/2008 | Melanson et al. | 315/292 |
| 2009/0110922 | A1 | 4/2009 | Hirose | |
| 2009/0146580 | A1 * | 6/2009 | Van Casteren et al. | 315/291 |
| 2009/0159779 | A1 | 6/2009 | Lu | |
| 2009/0243982 | A1 * | 10/2009 | Lee et al. | 345/88 |
| 2010/0127299 | A1 * | 5/2010 | Smith et al. | 257/99 |
| 2011/0089855 | A1 * | 4/2011 | Roberts et al. | 315/291 |
| 2011/0301865 | A1 * | 12/2011 | Anderson et al. | 702/24 |
| 2013/0264959 | A1 * | 10/2013 | Yamazaki et al. | 315/200 R |

FOREIGN PATENT DOCUMENTS

| | | | |
|---|---|---|---|
| EP | 2283934 | A2 * | 2/2011 |
| JP | 4-275151 | A | 9/1992 |
| JP | 11-34286 | A | 2/1999 |
| JP | 2000-29980 | A | 1/2000 |
| JP | 2001-232852 | A | 8/2001 |
| JP | 2004-351654 | A | 12/2004 |
| JP | 2005-123151 | A | 5/2005 |
| JP | 2005-227241 | A | 8/2005 |
| JP | 2005-238562 | A | 9/2005 |
| JP | 2006-188714 | A | 7/2006 |
| JP | 2007-101727 | A | 4/2007 |
| JP | 2006-318773 | A | 2/2008 |
| JP | 2008-41650 | A | 2/2008 |
| TW | 200508029 | | 3/2005 |
| TW | 200718560 | | 5/2007 |

OTHER PUBLICATIONS

The First Office Action for the Application No. 200980162712.0 from The State Intellectual Property Office of the People's Republic of China dated Oct. 8, 2013.
Supplementary European Search Report for the Application No. EP 09 85 1844 dated May 28, 2013.
Taiwanese Office Action for the Application No. 098141215 dated Sep. 30, 2013.
Notification of Reasons for Refusal for the Application No. 2008-275906 from Japan Patent Office mailed Mar. 31, 2011.

* cited by examiner

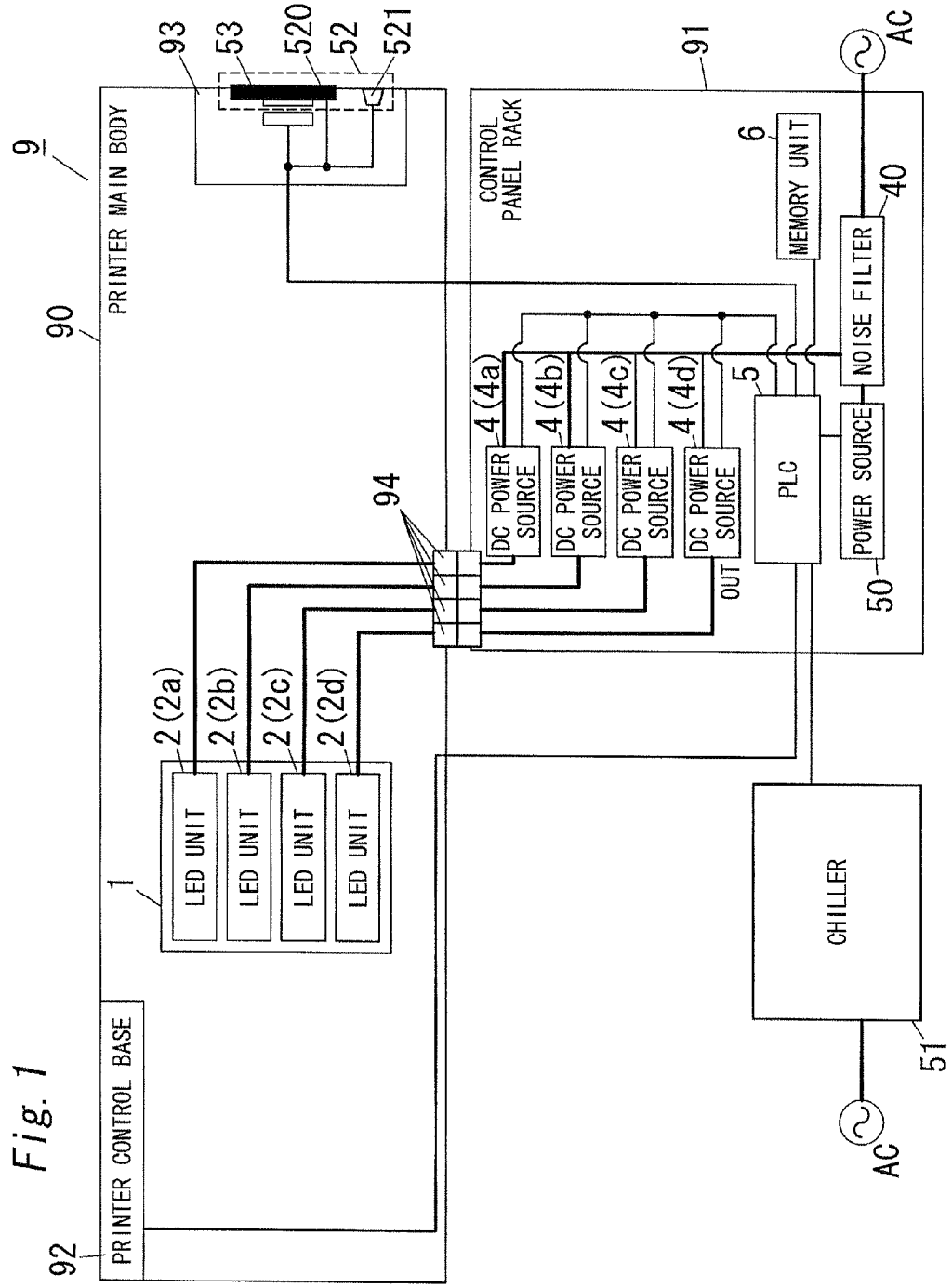

→ OUTPUT SET VALUE 100% LIGHTING
■ OUTPUT SET VALUE 70% DIMMING
▲ OUTPUT SET VALUE 50% DIMMING

| CUMULATIVE EMISSION TIME(h) | 1 | 3 | 7 | 10 | 30 | 70 | 100 | 300 | 700 | 1000 | 3000 | 7000 | 10000 |
|---|---|---|---|---|---|---|---|---|---|---|---|---|---|
| OUTPUT SET VALUE 100% LIGHTING | 1 | 1 | 1.004 | 1.01 | 1.02 | 1.036 | 1.042 | 1.075 | 1.099 | 1.117 | 1.198 | 1.351 | 1.493 |

| CUMULATIVE EMISSION TIME(h) | 1 | 3 | 7 | 10 | 30 | 70 | 100 | 300 | 700 | 1000 | 3000 | 7000 | 10000 | 30000 |
|---|---|---|---|---|---|---|---|---|---|---|---|---|---|---|
| OUTPUT SET VALUE 70% DIMMING | 1 | 1 | 1.003 | 1.005 | 1.01 | 1.015 | 1.02 | 1.036 | 1.047 | 1.058 | 1.087 | 1.13 | 1.17 | 1.449 |

| CUMULATIVE EMISSION TIME(h) | 1 | 3 | 7 | 10 | 30 | 70 | 100 | 300 | 700 | 1000 | 3000 | 7000 | 10000 | 30000 | 50000 |
|---|---|---|---|---|---|---|---|---|---|---|---|---|---|---|---|
| OUTPUT SET VALUE 50% DIMMING | 1 | 1 | 1.003 | 1.005 | 1.01 | 1.015 | 1.02 | 1.031 | 1.042 | 1.047 | 1.07 | 1.093 | 1.111 | 1.25 | 1.389 |

Fig. 6A

| RELATIVE LIGHT OUTPUT (%) | ATTENUATION RATE (%) | CUMULATIVE EMISSION TIME (h) |
|---|---|---|
| 100 | | |
| 99 | 1 | A1 |
| 98 | 2 | A2 |
| 97 | 3 | A3 |
| 96 | 4 | A4 |
| 95 | 5 | A5 |
| 94 | 6 | A6 |
| 93 | 7 | A7 |
| 92 | 8 | A8 |
| 91 | 9 | A9 |
| 90 | 10 | A10 |
| 89 | 11 | A11 |
| 88 | 12 | A12 |
| 87 | 13 | A13 |
| 86 | 14 | A14 |
| 85 | 15 | A15 |
| 84 | 16 | A16 |
| 83 | 17 | A17 |
| 82 | 18 | A18 |
| 81 | 19 | A19 |
| ⋮ | ⋮ | ⋮ |

Fig. 6B

| RELATIVE LIGHT OUTPUT (%) | ATTENUATION RATE (%) | CUMULATIVE EMISSION TIME (h) |
|---|---|---|
| 100 | | |
| 99 | 1 | B1 |
| 98 | 2 | B2 |
| 97 | 3 | B3 |
| 96 | 4 | B4 |
| 95 | 5 | B5 |
| 94 | 6 | B6 |
| 93 | 7 | B7 |
| 92 | 8 | B8 |
| 91 | 9 | B9 |
| 90 | 10 | B10 |
| 89 | 11 | B11 |
| 88 | 12 | B12 |
| 87 | 13 | B13 |
| 86 | 14 | B14 |
| 85 | 15 | B15 |
| 84 | 16 | B16 |
| 83 | 17 | B17 |
| 82 | 18 | B18 |
| 81 | 19 | B19 |
| ⋮ | ⋮ | ⋮ |

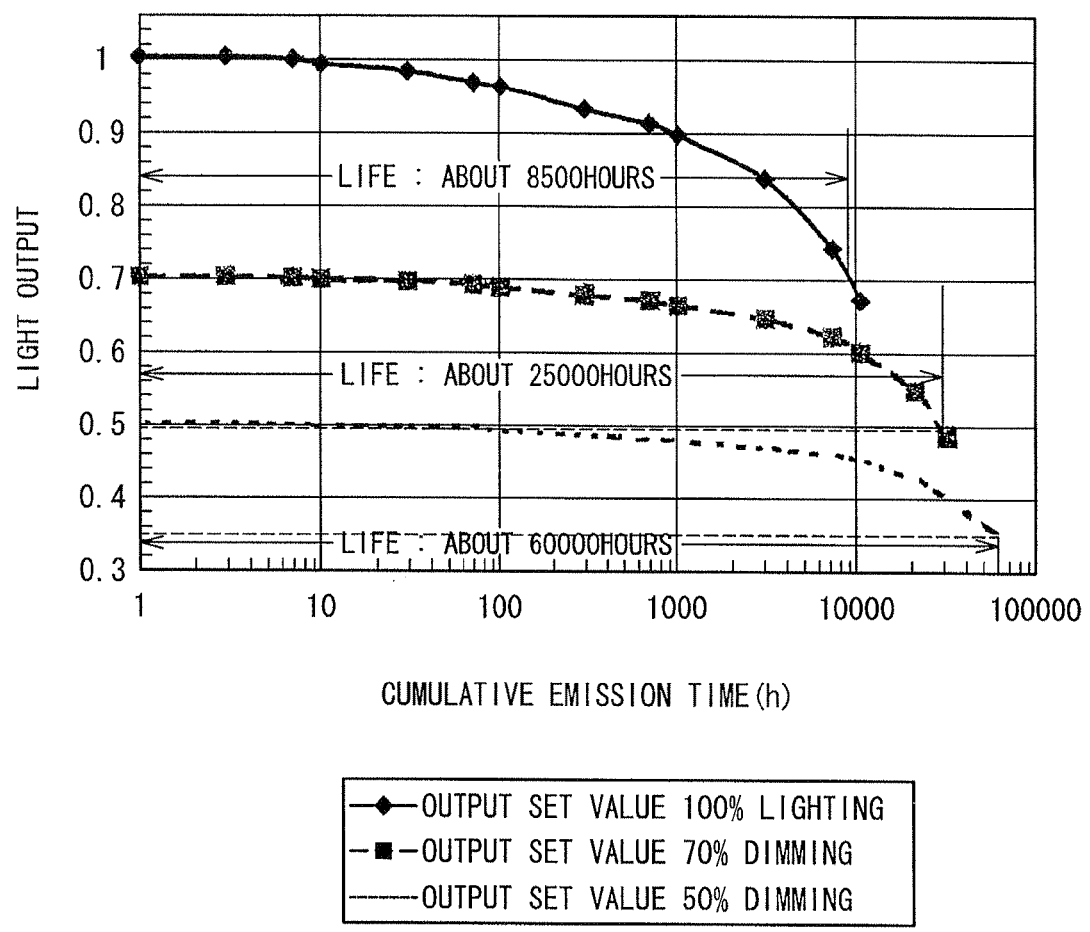

UV IRRADIATION APPARATUS

TECHNICAL FIELD

The present invention relates to a UV irradiation apparatus that irradiates UV rays.

BACKGROUND ART

Various kinds of conventional UV irradiation apparatuses have been developed and marketed for curing a section to be irradiated, for instance a UV-curable resin or coating material, through irradiation of UV rays onto the abovementioned section to be irradiated (for instance, Japanese Patent Application Publication No. 2004-351654). Such UV irradiation apparatuses are used, for instance, for the purpose of curing a UV-curable resin for bonding of an optical disk substrate, or fixing of a printing ink that is coated onto printing paper.

A plurality of straight pipe-type UV lamps that emit UV rays when supplied with power are widely used as light sources in conventional UV irradiation apparatuses. In such UV irradiation apparatuses, a plurality of straight pipe-type UV lamps is juxtaposed in such a manner that the axial directions of the UV lamps run along a predetermined direction, so that UV rays can be irradiated, over a long area, in the abovementioned predetermined direction.

Then, conventional UV irradiation apparatuses control, using a light amount correction table, in such a manner that the light amount of the UV lamps is kept substantially constant, regardless of the lighting time of the UV lamps.

Since UV lamps are used as light sources in conventional UV irradiation apparatuses, a problem arose, however, in that the power consumption required for emission of the UV rays is substantial.

Conventional UV irradiation apparatuses, moreover, control in such a manner that the light amount of the UV lamps is kept substantially constant, using light-amount correction data that is appropriate for a predetermined set value. Therefore, the above light-amount correction data cannot be used upon modification of a set value to a value dissimilar from the predetermined set value, in a case where UV rays are to be irradiated in a light amount that is different from that of the predetermined set value. This was problematic in that, as a result, the light amount of the UV lamps failed to be kept substantially constant.

DISCLOSURE OF THE INVENTION

In the light of the above, it is an object of the present invention to provide a UV irradiation apparatus that allows reducing power consumption required for emission of UV rays, and that allows the UV ray output to be kept constant, regardless of a cumulative emission time, even upon modification of an output set value.

A UV irradiation apparatus according to the present invention comprises an LED unit that is formed of a plurality of LED chips and that emits UV rays when supplied with current; measurement means for measuring an emission time of the LED unit; setting means for setting an output set value of the LED unit from among a plurality of candidate values; memory means for storing beforehand a correction table for each candidate value that can be set by the setting means; and emission control means for setting a power supplied to the LED unit. A cumulative value of the emission time is set to a cumulative emission time. The correction table associates, to each cumulative emission time, a correction value used for setting the power supplied to the LED unit in order to correct an output drop of each LED chip. The emission control means obtains a correction value of the cumulative emission time using the correction table of an output set value that is set by the setting means, and sets the power supplied to the LED unit using the obtained correction value. In a case where the output set value is modified by the setting means, the emission control means obtains the correction value for each cumulative emission time in such a manner that the output of the LED unit after modification is kept within an allowable range, by using a correction table of the output set value before modification and a correction table of the output set value after modification, and sets the supply power using the obtained correction value.

Through the use of an LED unit as a light source that emits UV rays, the above configuration allows reducing the power consumption that is required in order to emit UV rays, as compared with an instance where a UV lamp is used.

In such a configuration, the emission control means extracts a correction value of the cumulative emission time using a correction table, and sets the power supplied to the LED unit using the extracted correction value, as a result of which the output of the LED unit can be kept constant regardless of the cumulative emission time.

The above configuration allows moreover selectively setting the output set value of the LED unit, from among a plurality of candidate values, in accordance with the intended application, and enables halfway modification of the output set value, having been set once, to a new output set value.

Preferably, the emission control means obtains the correction value using the correction table every time there occurs an output drop of a magnitude set beforehand in a relative light output characteristic that denotes a relative light output of the LED unit with respect to the cumulative emission time, and sets the supply power using the obtained correction value.

Such a configuration allows reducing the output error of the LED unit, through correction of a decrement each time the output of the LED unit drops by a given amount, as compared with an instance where correction is performed at regular time intervals.

More preferably, in a case where the output set value is modified by the setting means, the emission control means extracts a correction value corresponding to the cumulative emission time upon modification using a correction table of the output set value before modification, extracts a cumulative emission time corresponding to the extracted correction value using a correction table of the output set value after modification, sets the extracted cumulative emission time to a new cumulative emission time after modification, obtains a correction value for each new cumulative emission time, and sets the supply power using the obtained correction value.

Such a configuration allows setting a new cumulative emission time after modification, by equalizing the correction value after modification of the output set value with the correction value before modification, upon modification of the output set value of the LED unit. Therefore, control can be performed also after modification, in consideration of the output drop (output deterioration) of the LED unit before modification.

Preferably, the UV irradiation apparatus further comprises input means for inputting a continuation request time for the output of the LED unit, wherein the setting means sets the output set value in such a manner that the LED unit emits UV rays until the continuation request time inputted by the input means has elapsed.

Such a configuration allows performing control in which the life time of the LED unit is given priority, in a case where there is decided a time (continuation request time) of desired use of the LED unit. In a case where the UV irradiation apparatus is used in a printer, for instance, the life time of the LED unit can be prolonged by reducing the output from the LED unit, when the printing speed may be comparatively slow.

In the UV irradiation apparatus, preferably, the LED unit is provided in plurality, and the UV irradiation apparatus further comprises detection means for detecting individually UV doses that are emitted by each LED unit, and the emission control means calculates an average value of the UV doses emitted by each LED unit using a detection value of the detection means, and performs, for each LED unit, feedback control of adjusting the magnitude of the supply power that is set using the correction value, in such a manner that the detection value of the detection means becomes the average value.

In such a configuration, the detection means detects individually UV doses that are emitted by each LED unit, the emission control means calculates an average value of the UV doses emitted by each LED unit using a detection value of the detection means, and performs, for each LED unit, feedback control of adjusting the magnitude of the supply power that is set using the correction value, in such a manner that the detection value of the detection means becomes the average value, thereby the UV dose variability between the LED units can be reduced, and UV dose uniformity can accordingly be enhanced within a wide irradiation range.

Preferably, the emission control means performs control so as to repeat a supply period in which current is supplied to each LED unit, and a stop period in which current supply is discontinued.

In such a configuration, the emission control means performs control so as to repeat a stop period and a supply period of current supply to the LED units, whereby each LED unit repeats an emission period and a stop period. Accordingly, the LED units that have heated up as a result of emission of UV rays can be cooled down during the stop period, and rises in the temperature of the LED units can be suppressed as a result. Accordingly, this allows reducing the influence of the temperature dependence of the LED units, and hence it becomes possible to stabilize the UV rays that are emitted by the LED units.

In such a configuration, the emission control means can set the current supplied to the LED units to be equal to or greater than a rated current, through current supply to the LED units only during the supply period. Therefore, intense UV rays can be emitted over just a given period of time, with good responsiveness, out of the LED units.

Preferably, the UV irradiation apparatus further comprises notification means for issuing a notification of a life time of the LED unit when the output set value is set by the setting means.

Such a configuration allows notifying a user of the life time of the LED unit that is changed for each output set value, through notification by the notification means of the life time of the LED unit in a case where there is outputted the output set value that is set by the setting means.

Preferably, the UV irradiation apparatus further comprises notification means for issuing a notification of a remaining life time of the LED unit.

Such a configuration allows informing the user of the remaining life time of the LED unit, through notification by the notification means of the remaining life time of the LED unit.

Preferably, the UV irradiation apparatus further comprises notification means for issuing a notification indicating that the LED unit has reached the end of its life.

Such a configuration allows prompting the user to exchange an LED unit when notified, by the notification means, to the effect that the LED unit has reached the end of its life.

Preferably, the UV irradiation apparatus further comprises notification means for issuing a notification of the occurrence of an output drop set beforehand, after the LED unit has reached the end of its life.

Such a configuration allows informing the user of an anomaly of the output drop of the LED unit, through notification by the notification means of the output drop after the LED unit has reached the end of its life.

BRIEF DESCRIPTION OF THE DRAWINGS

FIG. 1 is a block diagram of Embodiment 1;

FIGS. 6A and 6B are diagrams illustrating correction tables of the UV irradiation apparatus according to Embodiment 2;

FIG. 7 is a diagram for explaining a relative light output characteristic of a UV irradiation apparatus according to Embodiment 4.

BEST MODE FOR CARRYING OUT THE INVENTION

Embodiment 1

Figures 2A, 2B, 2C, 2D:
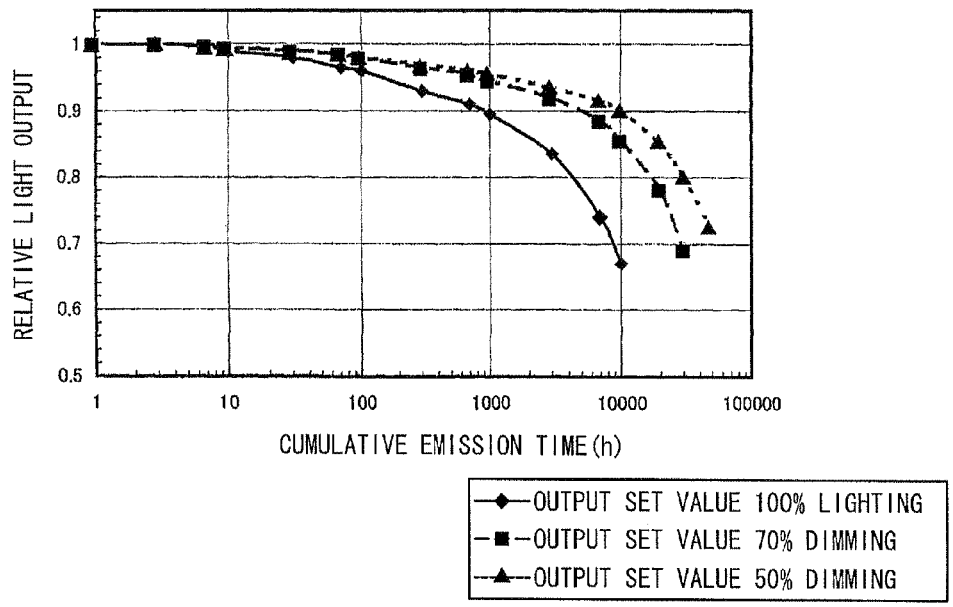
FIGS. 2A to 2D are diagrams for explaining a relative light output characteristic of a UV irradiation apparatus according to Embodiment 1.

The configuration of a UV irradiation apparatus according to Embodiment 1 will be explained first. FIG. 1 illustrates the configuration of a UV irradiation apparatus of the present embodiment. As illustrated in FIG. 1, the UV irradiation apparatus of the present embodiment is provided with an LED head 1 that comprises a plurality of LED units 2 that emit UV rays; a plurality of DC power sources 4 that supply DC power to respective LED units 2; and a PLC (programmable logic controller) 5 that controls the supply of power to respective LED units 2, through control of each DC power source 4. A memory unit (memory means) 6, a notification unit (notification means) 52 and an operation unit 53 are connected to the PLC 5.

Figure 3:
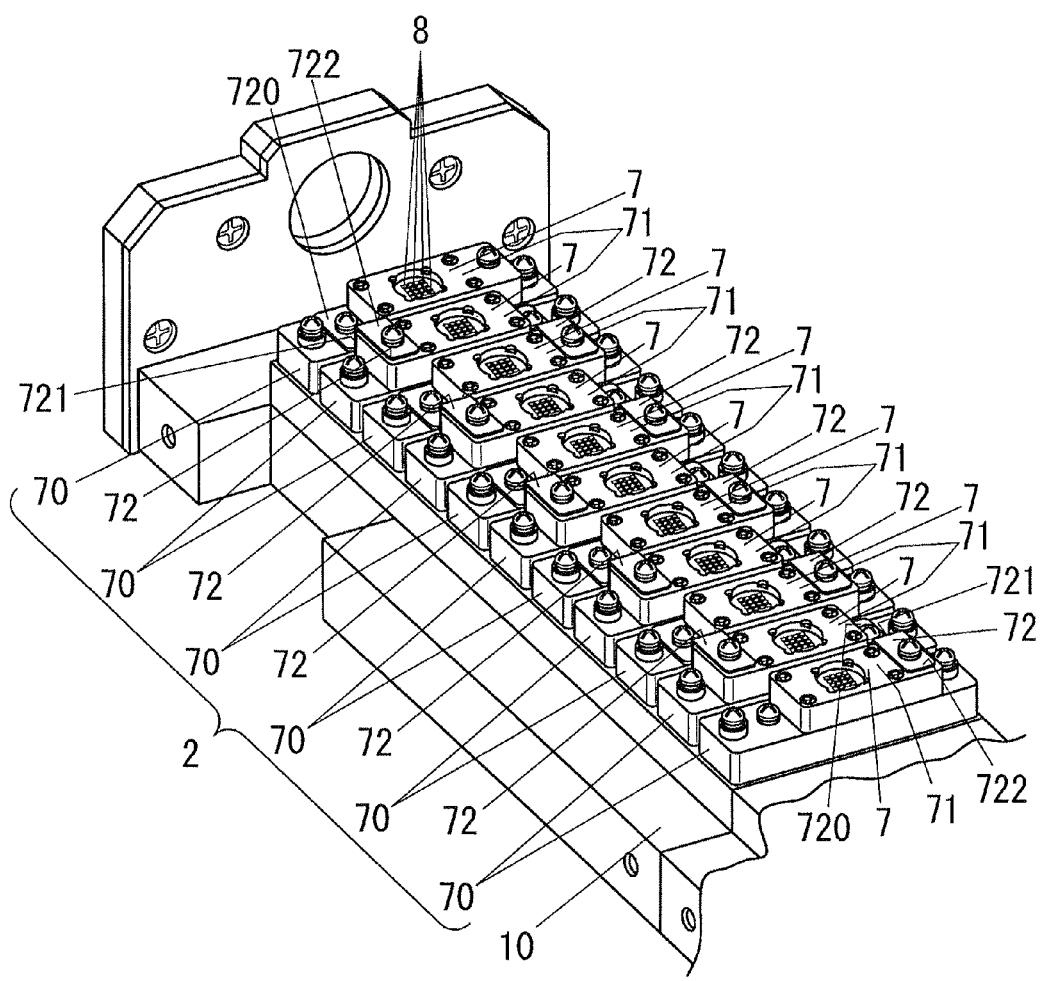
FIG. 3 is a perspective-view diagram illustrating a main portion of a UV irradiation apparatus.

Each LED unit 2 is provided with a plurality of LED modules 7 juxtaposed in the longitudinal direction, as illustrated in FIG. 3. All the LED modules 7 are electrically connected in series. Each LED module 7 is provided with a plurality of LED chips 8 (4×4=16 chips in FIG. 3). All the LED chips 8 provided in one same LED module 7 are electrically connected in series. Each LED chip 8 emits UV rays when supplied with current.

The DC power sources 4 illustrated in FIG. 1 receive AC power (single-phase AC 200V) from an AC power source AC, via a noise filter 40, and convert the AC power to DC power. The DC power is supplied to each LED unit 2, from a respective DC power source 4, on the basis of control by the PLC 5. A DC power source 4a supplies power to an LED unit 2a, a DC power source 4b supplies power to an LED unit 2b, a DC power source 4c supplies power to an LED unit 2c and a DC power source 4d supplies power to an LED unit 2d. Thus, each LED unit 2 is supplied with power independently from the other LED units 2.

The operation unit 53, which is provided in, for instance, a below-described operation panel 93 or the like, is means through which a user sets an output set value (UV dose) of each LED unit 2 from among a plurality of candidate values. That is, the operation unit 53 corresponds to the setting means of the present invention. Information of the output set value that is set in the operation unit 53 is outputted to the PLC 5. In the present embodiment, the candidate values of output set value that can be set in the operation unit 53 are of three kinds, namely full lighting (100% lighting), 70% dimming and 50% dimming. The candidate values of the output set value that can be set in the operation unit 53 are not limited to the abovementioned ones, and may be appropriately set in accordance with the intended application.

A correction table is stored beforehand, in the memory unit 6, for each candidate value that can be set in the operation unit 53. In the present embodiment, the correction table that is stored in the memory unit 6 is of three types, namely full lighting (100% lighting), 70% dimming and 50% dimming. Cumulative emission times, being cumulative values of the emission times of the LED units 2, are stored in the memory unit 6, through control by the PLC 5.

In the correction tables, respective correction values that are used for setting the supply power of each LED unit 2 are associated to each cumulative emission time, in order to correct the output drop (output deterioration) in the LED chips 8. Each correction table is worked out on the basis of a relative light output characteristic that denotes a relative light output of the LED units 2 with respect to cumulative emission time, as illustrated in FIG. 2A. The relative light output denotes a ratio of light output with respect to the light output of the LED units 2 at a time where the LED units 2 start being used. FIGS. 2B to 2D illustrate respective correction tables.

The PLC 5 illustrated in FIG. 1 is explained next. The PLC 5 has a measurement function of measuring the emission time of the LED units 2 and measuring cumulative emission times. That is, the PLC 5 corresponds to the measurement means of the present invention.

The PLC 5 has also an emission control function that involves: acquiring, from the above operation unit 53, information on the output set value that is set in the operation unit 53; extracting a correction value of the cumulative emission time in such a manner that the output of the LED units 2 is kept within an allowable range, for each cumulative emission time associated in the correction table, using the correction table (stored in the memory unit 6) of the acquired output set value; and setting the power that is supplied to the LED units 2 using the extracted correction value. That is, the PLC 5 extracts a correction value for each regular-interval cumulative emission time. The PLC 5 corresponds to the emission control means of the present invention.

In a case where the output set value is modified in the operation unit 53, i.e. in a case where information on the output set value after modification is acquired through the operation unit 53, the PLC 5 obtains a correction value for each cumulative emission time in such a manner that the output of the LED units 2 after modification is kept within an allowable range, using the correction table of the output set value before modification and the correction table of the output set value after modification, and sets the supply power using the obtained correction value.

The PLC 5, which carries out the above operation, operates by being supplied with power from a power source 50 that generates DC 24 V voltage. Herein, AC power is supplied to the power source 50 from the AC power source AC, via the noise filter 40. The power source 50 to which the AC power is supplied generates DC power out of the AC power. The PLC 5 controls a chiller 51 that in turn controls the temperature of a liquid (pure water) for cooling the LED units 2. The chiller 51 operates by AC power (3-phase AC 200 V) from the AC power source AC.

The notification unit 52 comprises a display screen 520 and a speaker 521. The notification unit 52 carries out the notification below, through control by the PLC 5. The notification unit 52 issues a notification of the life time of each LED unit 2 when an output set value is set in the operation unit 53. The notification unit 52 issues a notification of the remaining life time of each LED unit 2, at a timing set beforehand. The notification unit 52 issues a notification indicating that each LED unit 2 has reached the end of its life. The notification unit 52 also issues a notification of the occurrence of an output drop set beforehand, after each LED unit 2 has reached the end of its life. The notification method is a method that involves displaying a notification on the display screen 520, or a method that involves outputting a notification in the form of sound, out of the speaker 521.

Figure 4:
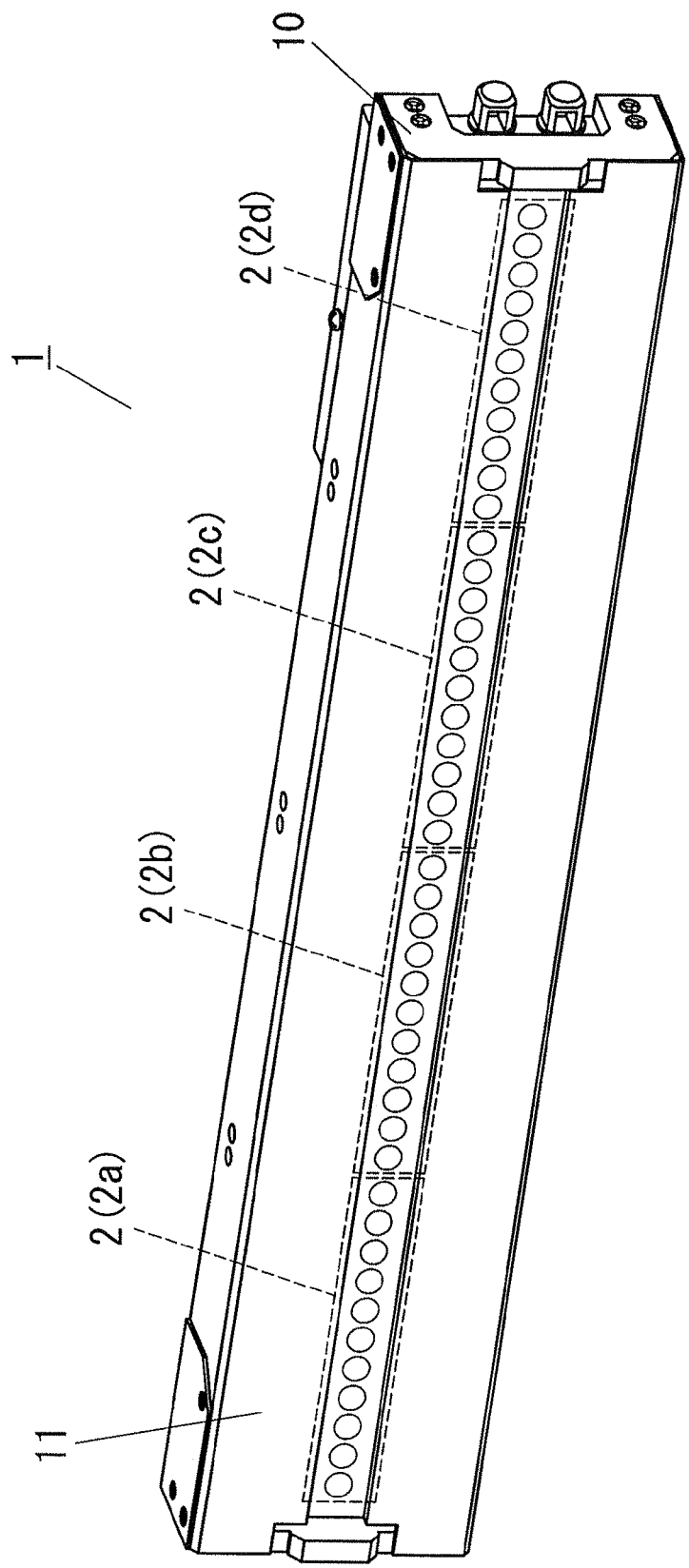
FIG. 4 is an external perspective-view diagram of a UV irradiation apparatus.

The structure of the LED head 1 according to the present embodiment is explained next with reference to FIGS. 3 and 4. As illustrated in FIG. 4, the LED head 1 comprises a plurality of LED units 2, a base 10 on which the LED units 2 are disposed in a row, and a cover 11 that covers the front of the base 10. Although not shown in the figure, cooling-water flow channels for cooling the LED units 2 are secured in the base 10.

As illustrated in FIG. 3, each LED module 7 of each LED unit 2 is provided with the plurality of LED chips 8, and is provided with a conductive base stand 70 and a cover 71 in which the LED chips 8 are housed. The base stand 70 and the cover 71 are electrically insulated from each other, and constitute respective electrodes of the LED chips 8.

Between adjacent LED modules 7 and 7, the base stand 70 of one LED module 7 and the cover 71 of the other LED module 7 are electrically connected to each other through a conductive connection piece 72. As a result, the plurality of LED modules 7 that are provided in one same LED unit 2 are electrically connected to each other in series. The connection piece 72 integrally comprises a lower face 720 that is attached to the base stand 70 of one LED module 7, an extension face 721 that extends upwards from one side of the lower face 720, and a top face 722 that extends from the top side of the extension face 721 and that is attached to the cover 71 of the other LED module 7. The base stand 70 and the connection piece 72, as well as the cover 71 and the connection piece 72, are fixed to each other by screwing.

The operation of the UV irradiation apparatus according to the present embodiment is explained next with reference to FIG. 1. In the memory unit 6 there is stored a correction table for each candidate value of the output set value of the LED units 2. The output set value is set in the operation unit 53 when UV rays are emitted for the first time from the LED units 2. Information on the output set value that is set in the operation unit 53 is outputted to the PLC 5 by the operation unit 53. Upon acquisition of the information on the output set value from the operation unit 53, the PLC 5 controls each DC power source 4 in such a manner that the current supplied to each LED unit 2 is an initial current. Each LED unit 2 emits UV rays on the basis of the supply current.

Upon setting of the output set value in the operation unit 53, if the LED units 2 have ever emitted UV rays thus far, the PLC 5 retrieves, from the memory unit 6, a cumulative emission time up to a previous emission, and acquires, from the correction table of the output set value, a correction value that corresponds to that cumulative emission time. Thereafter, the PLC 5 sets the magnitude of the power that is supplied to the LED units 2 using the acquired correction value. The LED units 2 emit UV rays on the basis of the supply current that flows on account of the supply power that is set by the PLC 5.

In a case where an output set value is set, in the operation unit 53, that is dissimilar from a previous output set value, the PLC 5 acquires, from a correction table of the new output set value, a correction value that corresponds to the cumulative emission time as retrieved from the memory unit 6. Next, the PLC 5 obtains correction values starting from the cumulative emission time thus far, using the correction table of the new output set value, and sets the magnitude of the power that is supplied to the LED units 2.

The PLC 5 measures the emission time of the LED units 2. When an emission time established beforehand has elapsed, the PLC 5 calculates the cumulative emission time, and adjusts the magnitude of power that is supplied to the LED units 2 using a correction value that corresponds to the calculated cumulative emission time.

Thereafter, upon termination of UV ray emission of the LED units 2, the PLC 5 stores in the memory unit 6, as a new cumulative emission time, a sum of the current emission time plus the cumulative emission time up to the previous emission.

A printer 9 in which the UV irradiation apparatus is housed is explained next with reference to FIG. 1. The printer 9 illustrated in FIG. 1 uses the UV irradiation apparatus in order to fix printing ink on printing paper by UV rays. The printer 9 is provided with a printer main body 90 that performs a printing process, and with a control panel rack 91. In the printer main body 90 there is provided a printer control base 92 comprising a printer control circuit that controls the operation of the printer main body 90, and an operation panel 93 for enabling an operator to set the operation of the printer 9.

The LED head 1 of the UV irradiation apparatus is mounted in the printer 9 in such a manner that UV rays can be irradiated onto printing paper having printing ink adhered thereon. The notification unit 52 and the operation unit 53 are attached to the operation panel 93. The DC power sources 4, the noise filter 40, the PLC 5, the power source 50 and the memory unit 6 are housed in the control panel rack 91. The LED units 2 and respective DC power sources 4 are electrically connected through connectors 94 that are provided on both the printer main body 90 and the control panel rack 91. The PLC 5 is connected to the printer control base 92 and the operation panel 93, and can control the printer control circuit of the printer control base 92 on the basis of the content set in the operation panel 93.

Thus, the present embodiment allows reducing the power consumption that is required in order to emit UV rays, as compared with an instance where a UV lamp is used, through the use of the LED units 2 as light sources that emit UV rays.

In the present embodiment, the PLC 5 extracts a correction value of a cumulative emission time, using a correction table, and sets the power that is supplied to the LED units 2 using the extracted correction value; thereby, the output of the LED units 2 can be kept constant regardless of the cumulative emission time. As a result, printing ink can be fixed to printing paper stably, regardless of the cumulative emission time of the LED chips 8 (FIG. 3) in a case where the UV irradiation apparatus is used in the printer 9, as in the present embodiment.

The present embodiment allows selectively setting the output set value of the LED units 2, from among a plurality of candidate values, in accordance with the intended application, and enables halfway modification of the output set value, having been set once, to a new output set value. As a result, the output of the LED units 2 can be modified and can be kept stably, upon changes in the type of printing ink, and upon changes in the surface area of the printing paper, in a case where the UV irradiation apparatus is used in the printer 9.

In addition to the above effect, the present embodiment allows notifying the user of the life time of the LED units 2 that is changed for each output set value, through notification by the notification unit 52 of the life time of the LED units 2 in a case where there is outputted the output set value that is set in the operation unit 53.

The present embodiment allows informing the user of the remaining life time of the LED units 2, through notification by the notification unit 52 of the remaining life time of the LED units 2.

The present embodiment, moreover, allows prompting the user to exchange an LED unit 2 when notified, by the notification unit 52, to the effect that the LED unit 2 has reached the end of its life.

The present embodiment allows informing the user of an anomaly of the output drop of an LED unit 2, through notification by the notification unit 52 of the output drop after the LED unit 2 has reached the end of its life.

Embodiment 2

The UV irradiation apparatus according to Embodiment 2 differs from the UV irradiation apparatus according to Embodiment 1 in that no correction value is extracted for each regular-interval cumulative emission time; instead, a correction value is extracted each time there occurs an output drop of a magnitude set beforehand. Constituent elements identical to those of Embodiment 1 are denoted with identical reference numerals, and an explanation thereof will be omitted.

The PLC 5 of the present embodiment extracts a correction value, using a correction table, each time there occurs an output drop of a magnitude set beforehand, in a light output characteristic that denotes the relative light output of the LED units 2 with respect to cumulative emission time, and sets the power that is supplied to the LED units 2 using the extracted correction value. The details are as follows.

Figure 5A:
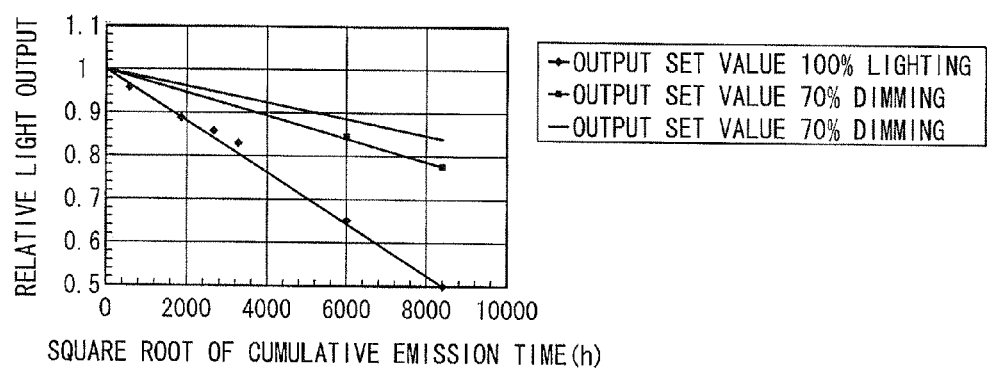
FIGS. 5A and 5B are diagrams for explaining a relative light output characteristic of a UV irradiation apparatus according to Embodiment 2.

In the present embodiment there is used a relative light output characteristic that denotes the relative light output of the LED units 2 with respect to the square root of cumulative emission time, for each candidate value of the output set value, as illustrated in FIG. 5A, upon creation of a correction table for each candidate value of the output set value. FIG. 5A illustrates the relative light output of the LED units 2 with respect not to cumulative emission time, but to the square root of cumulative emission time; however, there is no problem in using the latter instance as a characteristic that denotes the relative light output of the LED units 2 with respect to cumulative emission time.

A method for creating the correction table in the present embodiment is explained next. Firstly, the cumulative emission time upon each drop of output by 0.01 (1%) is extracted using the relative light output characteristic illustrated in FIG. 5A. The relative light output that decreases in 0.01 increments and the cumulative emission time are associated to each other, to create thereby a correction table such as the one illustrated in FIGS. 6A and 6B. FIG. 6A and FIG. 6B are correction tables of candidate values of dissimilar output set values (for instance, 50% dimming in FIG. 6A and 70% dimming in FIG. 6B). That is, a correction table such as the one in FIGS. 6A and 6B is created for each candidate value of the output set value. The correction tables are stored in the memory unit 6. Dissimilar numerical values, depending on the candidate value of the output set value, apply to A1 to A19 and B1 to B19 in FIGS. 6A and 6B.

The PLC 5 of the present invention illustrated in FIG. 1 acquires, from the operation unit 53, information on the output set value that is set in the operation unit 53; extracts a correction value of the cumulative emission time in such a manner that the output of the LED units 2 is identical to that at the beginning, for each cumulative emission time associated in the correction table, using the correction table (stored in the memory unit 6) of the acquired output set value. That is, the PLC 5 extracts a correction value of the cumulative emission time in such a manner that the output of the LED units 2 is kept within an allowable range. The PLC 5 sets the power that is supplied to the LED units 2 using the extracted correction value. The PLC 5 does not extract a correction value for each regular-interval cumulative emission time; instead, the PLC 5 extracts a correction value each time the output of the LED units 2 drops by 0.01.

The present embodiment allows reducing the output error of the LED units 2, as compared with an instance where correction is performed at regular time intervals, through correction of a decrement each time the output of the LED units 2 drops by a given amount.

Figure 5B:
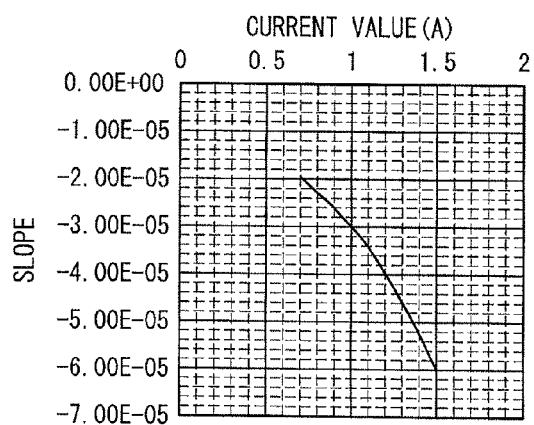

In Embodiment 2, there are firstly obtained slope characteristics of the characteristics of FIG. 5A, as illustrated in FIG. 5B, on the basis of the relative light output characteristic that is depicted in FIG. 5A, if candidate values of the output set value that can be set in the operation unit 53 are increased. Next, there is extracted a slope for each candidate value of the output set value, from the slope characteristic of FIG. 5B, to generate a relative light output characteristic. Thereafter, a correction table is created for each candidate value of the output set value, using the relative light output characteristic.

Embodiment 3

The UV irradiation apparatus according to Embodiment 3 differs from the UV irradiation apparatus according to Embodiment 2 in that, in a case where the output set value of the LED units 2 is modified, the correction values upon modification are adjusted according to the correction table of the output set value after modification. Constituent elements identical to those of Embodiment 2 are denoted with identical reference numerals, and an explanation thereof will be omitted.

In a case where the output set value is modified in the operation unit 53, the PLC 5 of the present embodiment illustrated in FIG. 1 extracts a correction value corresponding to the cumulative emission time upon modification using a correction table of the output set value before modification. Having extracted the correction value, the PLC 5 extracts a cumulative emission time corresponding to the extracted correction value using the correction table of the output set value after modification, and sets the extracted cumulative emission time to a new cumulative emission time after modification. Next, the PLC 5 obtains a correction value for each new cumulative emission time, and sets the power supplied to the LED units 2 using the obtained correction values.

Upon modification of the output set value of the LED units 2, the present embodiment allows setting a new cumulative emission time after modification, by equalizing the correction value after modification of the output set value with the correction value before modification. Therefore, control can be performed also after modification, in consideration of the output drop (output deterioration) of the LED units 2 before modification.

Embodiment 4

The UV irradiation apparatus according to Embodiment 4 differs from the UV irradiation apparatus according to Embodiment 1 in that the output set value is set in such a manner that the LED units 2 emit UV rays until a continuation request time for the output of the LED units 2 has elapsed. Constituent elements identical to those of Embodiment 1 are denoted with identical reference numerals, and an explanation thereof will be omitted.

The memory unit 6 in the present embodiment stores a correction table, obtained from the relative light output characteristic illustrated in FIG. 7, for each candidate value of the output set value.

The operation unit 53 of the present embodiment illustrated in FIG. 1 is means for inputting a continuation request time for the output of the LED units 2. Information on the inputted continuation request time is outputted to the PLC 5. In the present embodiment, the operation unit 53 corresponds to the input means of the present invention.

The PLC 5 of the present embodiment acquires, from the operation unit 53, information on a continuation request time as inputted at the operation unit 53, and, using the plurality of correction tables stored in the memory unit 6, sets an output set value in such a manner that the LED units 2 can output light until the acquired continuation request time has elapsed.

The present embodiment allows performing control in which the life time of LED units 2 is given priority, in a case where there is decided a time (continuation request time) of desired use of the LED units 2. For instance, the life time of the LED units 2 can be prolonged by reducing the output from the LED units 2, when the printing speed may be comparatively slow.

Embodiment 5

Figure 8:
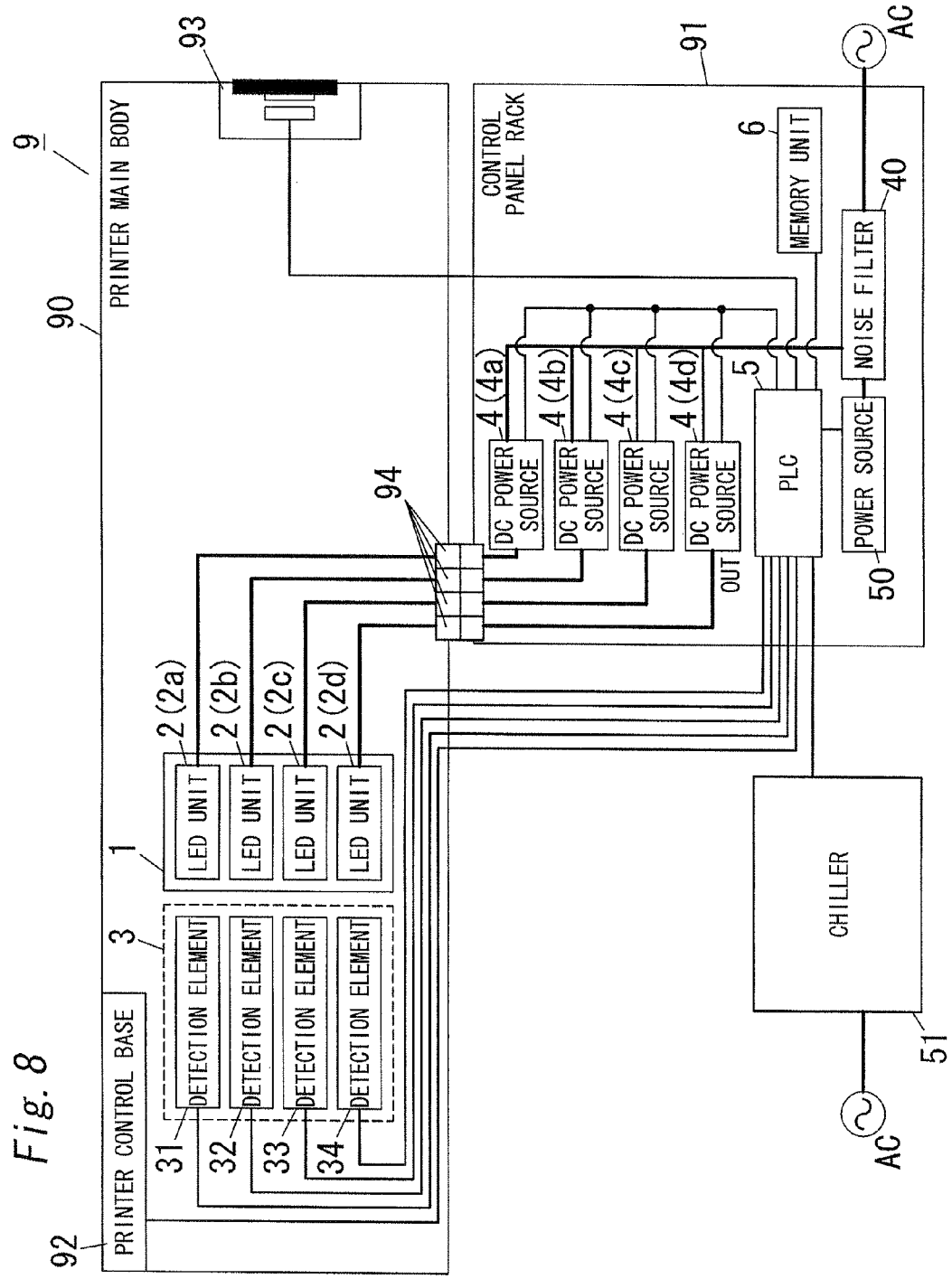
FIG. 8 is a block diagram of Embodiment 5.

The configuration of a UV irradiation apparatus according to Embodiment 5 will be explained first. FIG. 8 illustrates the configuration of a UV irradiation apparatus of the present embodiment. As illustrated in FIG. 8, the UV irradiation apparatus of the present embodiment is provided with an LED head 1 that comprises a plurality of LED units 2 that emit UV rays; a detection unit (detection means) 3 that detects UV rays emitted by the LED head 1, for each LED unit 2; a plurality of DC power sources 4 that supply DC power to respective LED units 2; and a PLC 5 that controls the supply of power to respective LED units 2, through control of each DC power source 4. A memory unit 6 is connected to the PLC 5. Constituent elements identical to those of Embodiment 1 are denoted with identical reference numerals, and an explanation thereof will be omitted. The LED units 2, the DC power sources 4, a power source 50 and a chiller 51 are identical to the LED units 2, the DC power sources 4, the power source 50 and the chiller 51 of Embodiment 1 (FIG. 1).

The detection unit 3 comprises a detection element 31 that detects a UV dose emitted by an LED unit 2a, a detection element 32 that detects a UV dose emitted by an LED unit 2b, a detection element 33 that detects a UV dose emitted by an LED unit 2c, and a detection element 34 that detects a UV dose emitted by an LED unit 2d.

Correction tables (FIGS. 2B to 2D) are stored beforehand in the memory unit 6. The correction tables set forth correction values that are used for setting the power that is supplied to the LED units 2, in order to correct deterioration of the LED chips 8 (FIG. 3) for respective cumulative emission times. The above correction tables are stored for each output set value that can be set in the PLC 5. Each correction table is worked out on from the relative light output characteristic illustrated in FIG. 2A.

Like the PLC 5 of Embodiment 1 (FIG. 1), the PLC 5 of the present embodiment illustrated in FIG. 8 has a measurement function of measuring a cumulative emission time, being a cumulative value of emission time from the start of emission in the LED units 2.

The PLC 5 selects, from the memory contents of the memory unit 6, a correction value corresponding to the cumulative emission time as measured using the measurement function, and sets the power that is supplied to the LED units 2 using the selected correction value.

The PLC 5 calculates an average value of the UV doses emitted by the LED units 2a to 2d, using the detection values of the detection elements 31 to 34 of the detection unit 3. Having calculated the above average value, the PLC 5 performs feedback control that involves further adjusting the magnitude of the supply power that is set using the correction values relating to the cumulative emission time in such a manner that the detection values of the detection elements 31 to 34 take on the above average value, for each LED unit 2a to 2d.

The operation of the UV irradiation apparatus according to the present embodiment is explained next with reference to FIG. 8. Correction tables that denote the relationship of correction values with respect to cumulative emission times are stored in the memory unit 6. The PLC 5 controls each DC power source 4, in such a manner that current supplied to the LED units 2 becomes an initial current, in a case where UV rays are emitted for the first time from the LED units 2. The LED units 2 emit UV rays on the basis of the supply current.

If the LED units 2 have ever emitted UV rays thus far, the PLC 5 retrieves, from the memory unit 6, a cumulative emission time up to a previous emission, and acquires, from the correction table, a correction value that corresponds to that cumulative emission time. Having acquired the correction value, the PLC 5 sets the magnitude of the current supplied to the LED units 2 using the acquired correction value. The LED units 2 emit UV rays on the basis of the supply current set by the PLC 5.

The PLC 5 measures the emission time of the LED units 2. When an emission time established beforehand has elapsed, the PLC 5 calculates the cumulative emission time, and adjusts the magnitude of current supplied to the LED units 2 using a correction value that corresponds to the calculated cumulative emission time.

The detection unit 3 detects individually the UV doses that are emitted by each LED unit 2, by way of the respective detection elements 31 to 34. The PLC 5 calculates the average value of the detection values detected by the detection elements 31 to 34. Thereafter, the PLC 5 adjusts, for each LED unit 2, the magnitude of the supply current in such a manner that the detection value of each detection element 31 to 34 becomes the abovementioned average value.

Thereafter, upon termination of UV ray emission of each LED unit 2, the PLC 5 stores in the memory unit 6, as a new cumulative emission time, a sum of the current emission time plus the cumulative emission time up to the previous emission.

A printer 9 in which the UV irradiation apparatus is housed is explained next with reference to FIG. 8. In the above printer 9, the detection unit 3 is provided at a position that allows detecting the UV rays emitted by each LED unit 2. Features other than the above are identical to those of the printer 9 of Embodiment 1 (FIG. 1).

The LED head 1 according to the present embodiment has the same structure as the LED head 1 (FIGS. 3 and 4) according to Embodiment 1.

Through the use of a plurality of LED units 2 as light sources that emit UV rays, the present embodiment allows reducing the power that must be consumed in order to emit UV rays, as compared with an instance where a UV lamp is used.

In the present embodiment, the PLC 5 measures the cumulative emission time of the LED units 2, selects, from the memory contents of the memory unit 6, a correction value corresponding to the measured cumulative emission time, and sets the power supplied to the LED units 2 using the selected correction value, as a result of which the UV dose can be kept constant regardless of the cumulative emission time. Accordingly, printing ink can be fixed to printing paper stably, regardless of the cumulative emission time of the LED chips 8 (FIG. 3), in a case where the UV irradiation apparatus is used in the printer 9, as in the present embodiment.

In the present embodiment, moreover, the detection unit 3 detects individually the UV doses that are emitted by each LED unit 2, by way of respective detection elements 31 to 34, the PLC 5 calculates the average value of the UV doses emitted by each LED unit 2, using the detection values of the respective detection elements 31 to 34, and performs, for each LED unit 2, feedback control that involves adjusting the magnitude of the supply current that is set using the correction values, in such a manner that the detection values of the detection elements 31 to 34 take on the above average value, thereby the UV dose variability between the LED units 2 can be reduced, and UV dose uniformity can accordingly be enhanced within a wide irradiation range. As a result, this allows printing ink to be fixed, evenly and reliably, over the entire printing paper area, even in cases of large printing paper coated with printing ink, in a case where a UV irradiation apparatus is used in the printer 9, as in the present embodiment.

Embodiment 6

In a case where, in the UV irradiation apparatus according to Embodiment 5, the current supplied to the LED units 2 illustrated in FIG. 8 is large, the LED units 2 keep on emitting UV rays continuously, whereupon the temperature of the LED units 2 goes on rising, and thus the emission characteristic of the LED units 2 may become impaired. Accordingly, it may be not possible, in some instances, to stabilize the UV rays that are emitted by the LED units 2 based on the magnitude of the current supplied to the LED units 2.

In Embodiment 6, therefore, a UV irradiation apparatus will be explained wherein UV rays emitted by the LED units 2 are stabilized by suppressing rises in the temperature of the LED units 2 illustrated in FIG. 8. The UV irradiation apparatus according to Embodiment 6 differs from the UV irradiation apparatus of Embodiment 5 in that the PLC 5 illustrated in FIG. 8 performs control in such a manner so as to repeat a supply period of current supply to the LED units 2, and a stop period in which current supply is discontinued. Constituent elements identical to those of Embodiment 5 are denoted with identical reference numerals, and an explanation thereof will be omitted.

Through control by the PLC 5, the LED units 2 in the present embodiment repeat an emission period of emission of UV rays and a stop period in which emission of UV rays is discontinued. That is, the LED units 2 irradiate in pulses. The operation of the LED units 2 involves, for instance, emission of UV rays for one second, within one cycle of three seconds, and a stopped state during the remaining two seconds. The emission time and length of each cycle are not limited to the abovementioned ones, and may be appropriately selected in accordance with the intended application.

When an emission period and a stop period are provided as described above, the LED units 2 revert to an original temperature through cooling during the stop period, even if the temperature has risen during the emission period. As a result, this allows reducing the probability of continued rise in the temperature of the LED units 2.

In a case where UV rays are emitted for the first time from each LED unit 2, the PLC 5 of the present embodiment can control a respective DC power source 4 in such a manner so as to set the current that is supplied to each LED unit 2 to be a rated current of each LED unit 2. In this case, the LED units 2 emit UV rays on the basis of a rated current.

The current supplied to the LED units 2 can be kept equal to or higher than the above rated current at all times, regardless of the length of the cumulative emission time of the LED units 2, through setting of the current supplied to the LED units 2 to the rated current of the LED units 2 upon emission start of the LED units 2. Therefore, UV rays as intense as possible can be emitted from the LED units 2 in a short time. The LED units 2 undergo early deterioration upon continued emission at a supply current that is equal to or greater than the rated current. However, deterioration may be smaller during pulsed emission of UV rays, even if the supply current is equal to or greater than the rated current.

The difference between Embodiment 5 and Embodiment 6 in the printer 9 in which the UV irradiation apparatus is housed will be explained next. In the same way as in Embodiment 5, the PLC 5 that is housed in the printer 9 performs control such that the length of the stop period of the LED units 2 and the travel speed of the printing paper are synchronized with each other. That is, the PLC 5 controls the printer control circuit of the printer control base 92 in such a way so as to modify the travel speed of printing paper in accordance with the length of the stop period of the LED units 2. Specifically, the PLC 5 controls the printer control circuit in such a way so as to slow down the travel speed of the printing paper as the stop period of the LED units 2 becomes longer, and controls the printer control circuit in such a way so as to increase the travel speed of the printing paper as the above stop period becomes shorter.

In the present embodiment, thus, the PLC 5 performs control so as to repeat a stop period and a supply period of current supply to the LED units 2, whereby the LED units 2 repeat an emission period and a stop period. Accordingly, the LED units 2 that have heated up as a result of emission of UV rays can be cooled down during the stop period, and rises in the temperature of the LED units 2 can be suppressed as a result. Accordingly, this allows reducing the influence of the temperature dependence of the LED units 2, and hence it becomes possible to stabilize the UV rays that are emitted by the LED units 2.

In the present embodiment, the PLC 5 can set the current supplied to the LED units 2 to be equal to or greater than the rated current, through current supply to the LED units 2 only during the supply period. Therefore, intense UV rays can be emitted over just a given period of time, with good responsiveness, out of the LED units 2.

The UV irradiation apparatuses of Embodiments 5 and 6 are not provided with the notification unit 52 (FIG. 1), but in a variation of the above UV irradiation apparatuses, the notification unit 52 may be provided in the same way as in Embodiment 1. If the UV irradiation apparatuses are provided with the notification unit 52, it becomes possible to issue a notification of the life time of the LED units 2, as well as the remaining time of the life time of the LED units 2, in the same way as in Embodiment 1. It becomes also possible to issue a notification indicating that an LED unit 2 has reached the end of its life, and to issue a notification of an output drop after the LED unit 2 has reached the end of its life.

The UV irradiation apparatuses of Embodiments 5 and 6 are not provided with the operation unit 53 (FIG. 1), but in a variation of the above UV irradiation apparatuses, the operation unit 53 may be provided in the same way as in Embodiment 1.

The above explanation concerns merely preferred embodiments of the present invention, but is not meant to limit the scope of the present invention. Modifications that can be envisaged by a person skilled in the art, as well as alterations carried out within the scope of the description, are encompassed within the scope of the invention.

The invention claimed is:

1. A UV irradiation apparatus, comprising:
an LED unit that is formed of a plurality of LED chips and that emits UV rays when supplied with current;
measurement means for measuring an emission time of the LED unit;
setting means for setting an output set value of the LED unit from among a plurality of candidate values;
memory means for storing beforehand a Plurality of correction tables corresponding to the plurality of candidate values that can be set by the setting means, respectively; and
emission control means for setting a power supplied to the LED unit,
wherein a cumulative value of the emission time is set to a cumulative emission time,
each of the plurality of correction tables associates, to each cumulative emission time, a correction value used for setting the power supplied to the LED unit in order to correct an output drop of each LED chip,
the emission control means obtains a correction value of the cumulative emission time using a correction table corresponding to an output set value that has been set by the setting means, among the plurality of correction tables, and sets the power supplied to the LED unit using the obtained correction value, and
in a case where the output set value is modified by the setting means, the emission control means extracts a correction value corresponding to the cumulative emission time upon modification using one correction table corresponding to the output set value before modification, table corresponding to the output set value after modification, among the plurality of correction tables, extracts a cumulative emission time corresponding to the extracted correction value from said another correction table, sets the extracted cumulative emission time to a new cumulative emission time after modification, obtains the correction value for each cumulative emission time after the new cumulative emission time in said another correction table in such a manner that the output of the LED unit after modification is kept within an allowable range, and sets the supply power using the obtained correction value.

2. The UV irradiation apparatus according to claim 1, wherein the emission control means obtains the correction value using the corresponding correction table every time there occurs an output drop of a magnitude set beforehand in a relative light output characteristic that denotes a relative light output of the LED unit with respect to the cumulative emission time, and sets the supply power using the obtained correction value.

3. The UV irradiation apparatus according to claim 1, further comprising:
input means thr inputting a continuation request time for the output of the LED unit,
wherein the setting means sets the output set value in such a manner that the LED unit emits UV rays until the continuation request time inputted by the input means has elapsed.

4. The UV irradiation apparatus according to claim 1, wherein the LED unit is provided in plurality, and
the UV irradiation apparatus further comprises detection means for detecting individually UV doses that are emitted by each LED unit, and
the emission control means calculates an average value of the UV doses emitted by each LED unit using, a detection value of the detection means, and performs, for each LED unit, feedback control of adjusting the magnitude of the supply power that is set using the correction value, in such a manner that the detection value of the detection means becomes the average value.

5. The UV irradiation apparatus according to claim 1, wherein the emission control means performs control so as to repeat a supply period in which current is supplied to each LED unit, and a stop period in which current supply is discontinued.

6. The UV irradiation apparatus according to claim 1, further comprising notification means for issuing a notification of a life time of the LED unit when the output set value is set by the setting means.

7. The UV irradiation apparatus according to claim 1, further comprising notification means for issuing a notification of a remaining life time of the LED unit.

8. The UV irradiation apparatus according to claim 1 further comprising notification means for issuing a notification indicating that the LED unit has reached the end of its life.

9. The UV irradiation apparatus according to claim 1, further comprising notification means for issuing a notification of the occurrence of an output drop set beforehand, after the LED unit has reached the end of its life.

* * * * *